(12) United States Patent
Park et al.

(10) Patent No.: US 12,027,389 B2
(45) Date of Patent: Jul. 2, 2024

(54) SUBSTRATE TREATMENT APPARATUS CONTAINING ELASTIC SUPPORT MEMBERS ATTACHED TO CHEMICAL RECOVERY UNIT

(71) Applicant: SEMES CO., LTD., Cheonan-si (KR)

(72) Inventors: In Hwang Park, Cheonan-si (KR); Sung Pil Kim, Hwaseong-si (KR); Kuk Saeng Kim, Goyang-si (KR); Kyung Min Kim, Daegu (KR)

(73) Assignee: SEMES CO., LTD., Cheonan-si (KR)

( * ) Notice: Subject to any disclaimer, the term of this patent is extended or adjusted under 35 U.S.C. 154(b) by 824 days.

(21) Appl. No.: 17/080,581

(22) Filed: Oct. 26, 2020

(65) Prior Publication Data
US 2021/0125841 A1    Apr. 29, 2021

(30) Foreign Application Priority Data
Oct. 28, 2019   (KR) ........................ 10-2019-0134574

(51) Int. Cl.
*H01L 21/67* (2006.01)
*H01L 21/687* (2006.01)

(52) U.S. Cl.
CPC .... *H01L 21/6715* (2013.01); *H01L 21/68742* (2013.01); *H01L 21/68764* (2013.01)

(58) Field of Classification Search
CPC .......... H01L 21/6715; H01L 21/68742; H01L 21/68764; H01L 21/67051; H01L 21/67023; H01L 21/67259
See application file for complete search history.

(56) References Cited

U.S. PATENT DOCUMENTS

| | | | |
|---|---|---|---|
| 9,799,538 B2 | 10/2017 | Kaneko et al. | |
| 2009/0090467 A1* | 4/2009 | Lee | H01L 21/6875 156/345.55 |
| 2012/0186744 A1* | 7/2012 | Higashijima | H01L 21/68792 156/345.21 |
| 2019/0390339 A1* | 12/2019 | Malinen | C23C 16/458 |

FOREIGN PATENT DOCUMENTS

JP  2000183010 A  *  6/2000
KR  10-2014-0067892 A  6/2014

* cited by examiner

*Primary Examiner* — John P. Dulka

(57) ABSTRACT

A substrate processing apparatus includes a rotation unit supporting and rotating a substrate, a chemical ejection unit ejecting a chemical fluid toward the rotation unit, a chemical recovery unit disposed close to the rotation unit and collecting a chemical fluid scattered from the rotation unit, a first lifting unit coupled to the chemical recovery unit and moving upward and downward the chemical recovery unit relative to the rotation unit, and a first position correction member allowing the chemical recovery unit to be elastically supported by the first lifting unit and changing a relative position of the chemical recovery unit with respect to the lifting unit.

17 Claims, 10 Drawing Sheets

SUBSTRATE TREATMENT APPARATUS CONTAINING ELASTIC SUPPORT MEMBERS ATTACHED TO CHEMICAL RECOVERY UNIT

CROSS REFERENCE TO RELATED APPLICATION

The present application claims priority to Korean Patent Application No. 10-2019-0134574, filed Oct. 28, 2019, the entire contents of which are herein incorporated by reference.

BACKGROUND OF THE INVENTION

1. Field of the Invention

The present invention relates to a substrate processing apparatus and, more particularly, to a substrate processing apparatus, a substrate processing equipment, and a substrate processing method that are suitably used to manufacture semiconductor devices.

2. Description of the Related Art

The miniaturization of circuit patterns has rapidly progressed with increases in density, integration, and performance of semiconductor devices. Contaminants such as particles of organic materials and metallic materials on the surface of a substrate have a significantly negative effect on the characteristics and production yield of semiconductor devices formed on the substrate. Therefore, a cleaning process of removing various contaminants on the surface of a substrate is considered very important when manufacturing semiconductor devices. The cleaning process is performed before and after each unit process constituting a semiconductor device manufacturing method.

There are many cleaning methods and the cleaning methods are classified into dry and wet types. The wet cleaning methods use chemical dissolution for removal of contaminants and can be classified into: a bath cleaning technique in which a substrate is immersed in a chemical fluid to remove contaminants attached to the surface of a substrate; and a spin cleaning technique in which a chemical fluid is applied to a substrate placed on a spin chuck that is rotating.

Specifically, the spin cleaning technique includes a step of fixedly putting a substrate on a spin chuck with which a single substrate can be treated at one time, a step of supplying a chemical fluid or deionized water to the substrate through a spray nozzle while rotating the substrate, and a step of cleaning the substrate by centrifugally spreading the chemical fluid or deionized water over the entire area of the substrate, and a step of drying the substrate with drying gas.

When a substrate processing apparatus that performs a fluid-involved treatment process on a substrate is used, a chemical fluid that is used is collected and recycled. A recovery device has a plurality of compartments for storing different chemical fluids introduced from the outside. The recovery device is equipped with lifting units that move the recovery device up and down so that various chemical fluids can be introduced into the respective compartments.

Each of the lifting units may be implemented with a pneumatic cylinder. The pneumatic cylinder is typically composed of a cylinder and a piston. The pneumatic cylinders mounted to the recovery device have a problem in that an internal pressure difference occurs between the pneumatic cylinders in a standby state prior to the operation of the recovery unit. The pressure difference results in a height difference between the pneumatic cylinders by which the recovery unit is supported.

In this case, the recovery unit is likely to tilt, thereby exerting a transverse load to the cylinders. Because of this, wear easily occurs in the sealing ring installed on the periphery of the piston, and air leaks from the bottom of the cylinder. Consequently, there is a possibility that the lifting units malfunction.

In addition, when the recovery unit tilts excessively, a chemical fluid cannot be introduced into the target compartment in the recovery unit and may be erroneously introduced into a non-target compartment. The erroneously introduced chemical fluid will be mixed with another chemical fluid stored in the non-target compartment and thus the recovered chemical fluid cannot be reused.

DOCUMENT OF RELATED ART

Patent Document (Patent Document 1) Korean Patent Application Publication No. 2014-0067892

SUMMARY OF THE INVENTION

An objective of the present invention is to provide a substrate processing apparatus capable of being reliably operable and of preventing breakage of a substrate, a substrate processing equipment including the apparatus, and a substrate processing method using the apparatus and facility.

According to an exemplary embodiment of the present invention, a substrate processing apparatus includes a rotation unit configured to support and rotate a substrate, a chemical ejection unit configured to eject a chemical fluid toward the rotation unit, a chemical recovery unit disposed close to the rotation unit and configured to collect a chemical fluid scattered from the rotation unit, a first lifting unit coupled to the chemical recovery unit and configured to move upward and downward the chemical recovery unit relative to the rotation unit, and a first position correction member configured to allow the chemical recovery unit to be elastically supported by the first lifting unit and change a relative position of the chemical recovery unit with respect to the lifting unit.

The chemical recovery unit includes a body portion configured to collect the chemical fluid scattered from the rotation unit, and a bracket portion protruding outward from the body portion, wherein the lifting unit is coupled to the bracket portion of the chemical recovery unit.

The lifting unit includes a movable member having a rod shape, having an end portion passing through the bracket portion, and configured to support the first position correction member, a driving force generation member configured to raise and lower the movable member, and a retaining member coupled to an end portion of the movable member in a state in which the end portion of the movable member passes through the bracket portion.

The first position correction member is installed to surround the movable member and is positioned between the driving force generation member and the bracket portion.

The substrate processing apparatus further includes a stress prevention member positioned between the retaining member and the bracket portion and installed such that the movable member extends through the stress prevention member.

The stress prevention member has a spherical shape.

The first position correction member includes a lower position correction member that is installed to surround the movable member and positioned between the driving force generation member and the bracket portion, and an upper position correction member that is positioned between the retaining member and the bracket portion.

The first position correction member is a compression spring.

The driving force generation member includes a cylinder having an interior space, a piston positioned in the interior space of the cylinder, coupled to the movable member, and configured to be movable along a longitudinal direction of the cylinder, and a pressure regulator connected to the cylinder and configured to adjust a pressure in the interior space of the cylinder.

According to an exemplary embodiment of the present invention, a substrate processing equipment includes a load port configured to support a substrate carrier in which a substrate is contained, a substrate processing apparatus, and an index chamber in which a transfer robot that transfers the substrate from the substrate carrier supported on the load port to the substrate processing apparatus is disposed. The substrate processing apparatus includes a rotation unit configured to support and rotate a substrate, a chemical ejection unit configured to eject a chemical fluid toward the rotation unit, a chemical recovery unit disposed close to the rotation unit and configured to collect a chemical fluid scattered from the rotation unit, a first lifting unit coupled to the chemical recovery unit and configured to move upward and downward the chemical recovery unit relative to the rotation unit, and a first position correction member configured to allow the chemical recovery unit to be elastically supported by the first lifting unit and change a relative position of the chemical recovery unit with respect to the lifting unit.

According to an exemplary embodiment of the present invention, a method of processing a substrate includes rotating a substrate supported on a rotation unit, ejecting a chemical fluid onto the substrate using a chemical ejection unit, and raising or lowering a chemical recovery unit disposed close to the rotation unit with a lifting unit, and collecting the chemical fluid with the chemical recovery unit. The chemical recovery unit is elastically supported by a position correction member.

The substrate processing apparatus may include the position correction member. The position correction member may be installed between the lifting unit and the chemical recovery unit. The lifting units are installed on the left and right sides of the chemical recovery unit, respectively. Although a pressure difference between the cylinders causes a height difference between the movable members, the chemical recovery unit can be oriented almost horizontally due to the position correction member.

Therefore, it is possible to prevent the cylinder or piston included in the driving force generation member from being damaged. For example, when the cylinder is a pneumatic cylinder, it is possible to prevent air from leaking and to ensure that the piston reaches the target position.

The substrate processing apparatus according to the present invention enables the chemical fluid recovery unit to be horizontally oriented at all times, thereby enabling various chemical fluids to be easily introduced into the respective targeted inlets of the chemical recovery unit. Consequently, it is possible to prevent the recovered chemical fluids from being mixed with each other. This enables the recovered chemical fluids to be reused.

DESCRIPTION OF THE EXEMPLARY EMBODIMENTS

Figure 1:
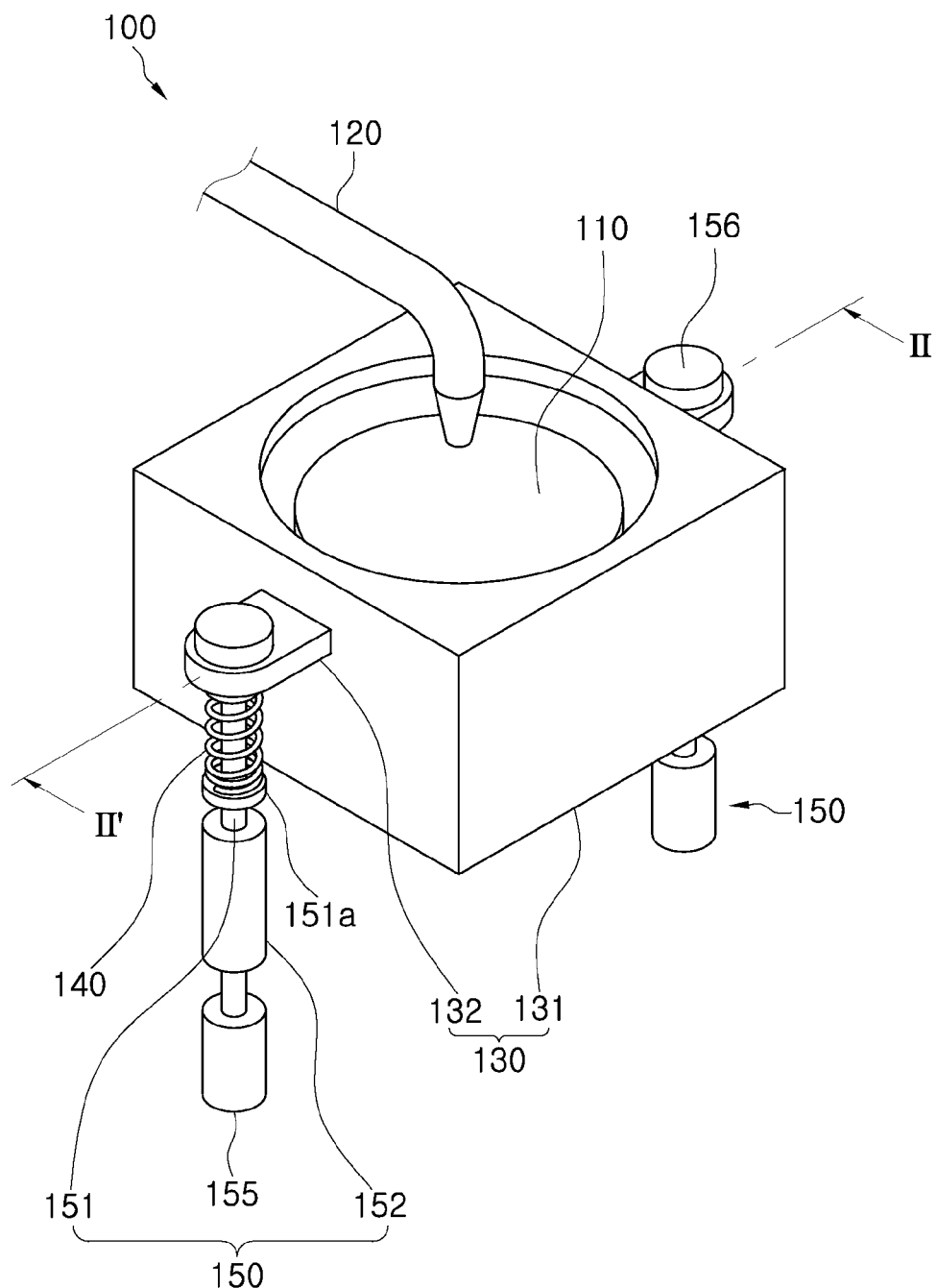
FIG. 1 is a perspective view illustrating a substrate processing apparatus according to a first embodiment of the present invention.

Hereinbelow, exemplary embodiments of the present invention will be described in detail with reference to the accompanying drawings such that the invention can be easily practiced by those ordinarily skilled in the art to which the present invention pertains. The present invention can be embodied in various forms and should not be construed as being limited to the exemplary embodiments disclosed herein.

A description of elements that are not related to the invention will be omitted to clarify the invention, and identical or similar elements are denoted by identical or similar reference characters throughout the drawings and the detailed description below.

In various embodiments, components having the same configuration will be denoted by the same reference numerals, and only a representative embodiment will be described. For the other exemplary embodiments, only components that differ from those of the representative embodiment will not be described.

When an element is described as being "connected to", "combined with", or "coupled to" another element, it should be understood that the element may be connected to, combined with, or coupled to another element directly or with another element interposing therebetween. It will be further understood that the terms "comprises," "comprising,", "includes" and/or "including," when used herein, specify the presence of stated features, integers, steps, operations, elements, and/or components, but do not preclude the presence or addition of one or more other features, integers, steps, operations, elements, components, and/or groups thereof.

In addition, unless otherwise defined, all terms including technical and scientific terms used herein have the same meaning as commonly understood by those who are ordinarily skilled in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
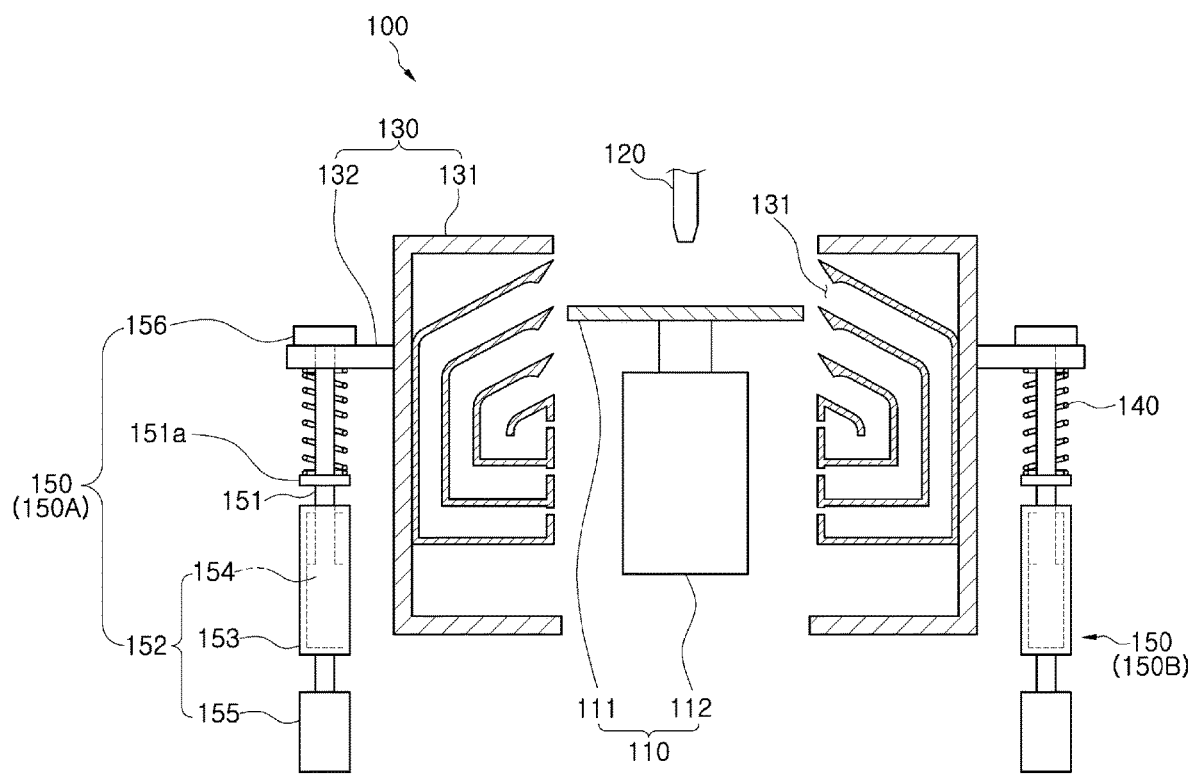
FIG. 2 is a cross-sectional view of the substrate processing apparatus, which is taken along line II-II' of FIG. 1.

Referring to FIGS. 1 to 2, according to a first embodiment of the present invention, a substrate processing apparatus 100 includes a rotation unit 110, a chemical ejection unit 120, a chemical recovery unit 130, a lifting unit 150, and a position correction member 140.

The rotation unit 110 supports and rotates a substrate (not illustrated). The rotation unit 110 includes, for example, a support plate 111 and a rotation motor 112.

The support plate 111 supports a substrate. The support plate 111 is larger in size than the substrate. When the substrate is a circular wafer, the support plate 111 may be a circular plate having a larger diameter than the wafer.

The rotation motor 112 is positioned below the support plate 111. The rotation motor 112 rotates the support plate 111.

When the substrate is seated on the support plate 111, the support plate 111 is rotated and the substrate on the support plate is accordingly rotated. When a chemical fluid is ejected to the center of the substrate, the chemical fluid spreads over the entire surface area of the substrate, even up to the edge of the substrate, due to centrifugal force.

The chemical ejection unit 120 ejects a chemical fluid toward the rotation unit 110. The chemical ejection unit 120 pumps a chemical fluid stored in a storage tank (not illustrated) and ejects the chemical fluid to the substrate.

The chemical fluid is used for a variety of purposes. The chemical fluid is one or more solutions selected from the group consisting of fluoric acid (HF), sulfuric acid ($H_2SO_4$), nitric acid ($HNO_3$), phosphoric acid ($H_3PO_4$), and SC-1 solution (which is a mixture of ammonium hydroxide ($NH_4OH$), hydrogen peroxide ($H_2O_2$), and water ($H_2O$)).

When the chemical fluid is used for cleaning, the chemical fluid may be deionized water (DIW). On the other hand, when the chemical fluid is used for drying, the chemical fluid may be nitrogen ($N_2$), isopropyl alcohol (IPA), or the like.

The chemical recovery unit 130 is positioned close to the rotation unit 110 and collects a chemical fluid escaping from the rotation unit 110. In more detail, the chemical recovery unit 130 is installed to surround the entire circumference of the rotation unit 110 to recover a chemical fluid scattered from the rotation unit 110.

The chemical recovery unit 130 includes a body portion 131 and two bracket portions 132.

The body portion 131 recovers the chemical fluid and stores the collected chemical fluid. The external shape of the chemical recovery unit 130 is a block shape having an opening in the top surface thereof. The opening formed in the top surface of the body portion 131 is used as an entrance through which the substrate can be loaded and unloaded.

The bracket portions 132 protrude outward from respective side surfaces of the body portion 131. The bracket portions 132 extend outward from the respective side surfaces of the body portion 131.

A lifting unit 150 extends in a vertical direction and is engaged with each bracket portion 132 in such a manner that an upper end portion of the lifting unit 150 passes through the bracket portion 132. When the upper end portion of the lifting unit 150 moves up or down, the bracket portion 132 is raised or lowered. The bracket portion 132 is not raised or lowered by the same distance as the moving distance of the lifting unit 140 due to the action of the position correction member 140 to be described below. The movement mechanism of the bracket portion will be described latter in detail.

The chemical recovery unit 130 can separately recover different chemical fluids used in manufacturing processes. The body portion 131 of the chemical recovery unit 130 has a plurality of inlets through which respective chemical fluids can be introduced into the chemical recovery unit 130.

The inlets are arranged in a vertical direction. That is, the inlets are positioned at different heights.

In a process of treating the substrate, various chemical fluids can be separately introduced into the body portion 131 through the multiple inlets, respectively, and stored in respectively different compartments in the chemical recovery unit 130. For example, the chemical fluids introduced into the chemical recovery unit through the respective inlets are separately transferred to external chemical regeneration units (not illustrated) via recovery lines. The chemical regeneration unit is an apparatus for regenerating a chemical fluid so as to be reused. For example, the chemical regeneration unit adjusts the concentration and temperature of the recovered chemical fluid and filters the recovered chemical fluid.

In the process of treating a substrate, contaminants such as particles generated during a substrate treatment process may be introduced into the chemical recovery unit 130 or fume may be generated from the remaining chemical fluid stored in the chemical recovery unit. These contaminants are removed by the chemical regeneration unit. Therefore, it is possible to prevent the contaminants from contaminating a substrate in the subsequent substrate treatment process when the collected used chemical fluids are reused.

The chemical recovery unit 130 and the chemical ejection unit 120 described above are existing ones that are usually used in conventional substrate processing apparatuses. Therefore, herein a detailed description of the chemical recovery unit 130 will be omitted.

The lifting units 150 are coupled to the chemical recovery unit 130. Each of the lifting units 150 enables the chemical recovery unit 130 to move up and down relative to the rotation unit 110. The lifting units are installed on the left and right sides of the chemical recovery unit 130, respectively.

Each of the lifting units 150 includes a movable member 151, a driving force generation member 152, and a retaining member 156.

The movable member 151 has a rod shape. The movable member 151 is installed to pass through the bracket portion 132. The bracket portion 132 is freely movable relative to the movable member 151.

The movable member 151 is configured to support the position correction member 140. A restriction protrusion 151a is installed to surround the circumference of a portion of the movable member 151.

The restriction protrusion 151a is in tight contact with the bottom of the position correction member 140 when the direction in the drawing is a reference direction. The restriction protrusion 151a has a ribbon shape and is installed to surround the entire circumference of a portion of the movable member 151.

Alternatively, although not illustrated in the drawing, the lower end of the position correction member 140 may be fixedly coupled to the movable member 151 so that the movable member 151 can support the position correction member 140.

The driving force generation member 152 moves the movable member 151 up and down. The mechanism of the driving force generation member 152 is not particularly limited if it can move the movable member 151. For example, the driving force generation member 152 may be hydraulic type or pneumatic type. In an example embodiment, the driving force generation member 152 may be a mechanical device which generates a force in a reciprocating linear motion. For example, the driving force generation member 152 may include a hydraulic cylinder or a pneumatic cylinder.

The driving force generation member 152 includes a cylinder 153, a piston 154, and a pressure regulator 155.

The cylinder 153 has an interior space in which the piston 154 can move.

The piston 154 is received in the cylinder 153 and is coupled to the movable member 151. The piston 154 is moved in a longitudinal direction of the cylinder 153.

The pressure regulator 155 is connected to the cylinder 153 and regulates the pressure in the interior space of the cylinder 153.

In more detail, the pressure regulator 155 feeds compressed air to a lower portion of the cylinder 153 or draws air from the lower portion of the cylinder 153. The lower portion of the cylinder 153 refers to an interior space below the piston 154.

When the pressure regulator 155 supplies compressed air to the cylinder 153, the piston 154 ascends. On the other hand, when the pressure regulator 155 draws out the compressed air from the lower portion of the cylinder 153, the piston 154 descends.

A retaining member 156 is coupled to an end portion of the movable member 151 in a state in which the movable member 151 vertically extends through the bracket portion 132. The retaining member 156 is positioned on the bracket portion 132 in terms of the direction as shown in the drawing. The retaining member 156 prevents the movable member 151 from escaping from the bracket portion 132.

When the driving force generation member 152 raises the movable member 151, the position correction member 140 accordingly rises. As described above, since the bracket portion 132 of the chemical recovery unit 130 is elastically supported by the position correction member 140, the chemical recovery unit 130 is lifted when the position correction member 140 rises. Conversely, when the driving force generation member 152 lowers the movable member 151, the chemical recovery unit 130 is lowered.

Each of the position correction members 140 enables the chemical recovery unit 130 to be elastically supported by the lifting unit 150. The position correction member 140 changes the relative position of the chemical recovery unit 130 with respect to the lifting unit 150. The number of the position correction members 140 may be one or more. A case where the number of the position correction members 140 is two or more will be described later.

The position correction member 140 is installed to surround the movable member 151 and is interposed between the driving force generation member 152 and the bracket portion 132. The position correction members 140 are compression springs. An end of the compression spring is in tight contact with the bracket portion 132.

The cylinders 153 in the respective driving force generation members 152 of the respective lifting units 150 may be in different states. In this state, when the lifting units 150 start operating, a height difference is generated between the movable members 151 of the respective driving force generation members 152. The position correction members 140 correct the height difference to prevent the chemical recovery unit 130 from tilting.

The substrate processing apparatus according to one embodiment of the present invention additionally includes a controller for performing a substrate treatment process. According to one embodiment of the present invention, a substrate processing method includes: rotating a substrate supported on a rotation unit 110; ejecting a chemical fluid onto the top surface of the substrate through a chemical ejection unit 120; raising a chemical recovery unit 130 disposed close to the rotation unit 110 with lifting units 150; and recovering a chemical fluid. The chemical recovery unit 130 is elastically supported by the lifting units 150 and the position correction members 140.

During the operation of the substrate processing apparatus according to one embodiment of the present invention, it is possible to prevent the chemical recovery unit from tilting. It can be confirmed through a test described below.

In the test, for each of a substrate processing apparatus according to one embodiment of the present invention and a substrate processing apparatus according to a comparative example, a displacement difference between the left and right brackets of a chemical recovery unit and a transverse load applied to a cylinder are measured.

In the test, as the substrate processing apparatus according to one embodiment of the invention, the substrate processing apparatus illustrated in FIG. 2 is used. The substrate processing apparatus according to the comparative example, used in the test, is a conventional substrate processing apparatus unequipped with position correction members.

Each of the substrate processing apparatus according to one embodiment and the substrate processing apparatus according to the comparative example is operated such that the chemical recovery unit is raised, is then maintained at a certain height, and is finally lowered.

Figure 3:
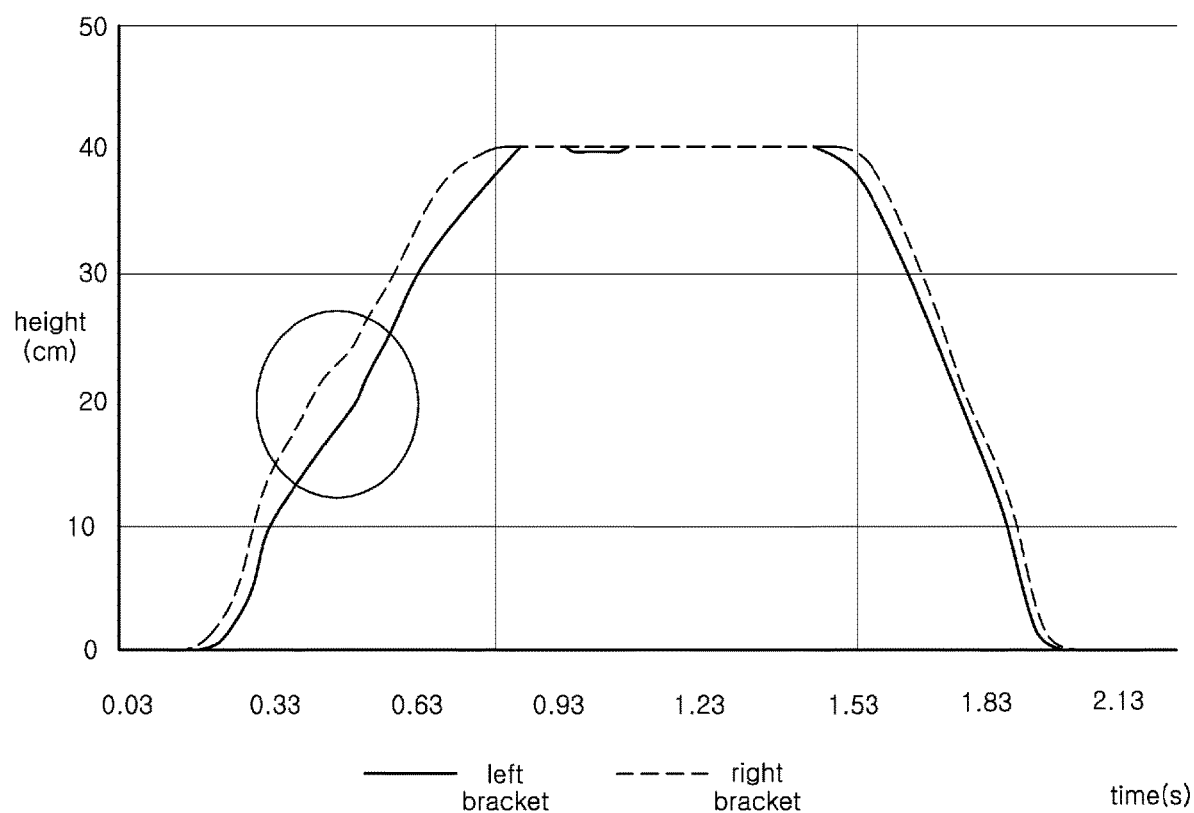
FIG. 3 is a graph showing the height of each of the left and right parts of a chemical recovery unit during operation of a substrate processing apparatus according to a comparative example.

Referring to FIG. 3, a slight difference in displacement between the left and right bracket portions of the chemical recovery unit occurred within a period between 1.6 seconds and 2.0 seconds during which the chemical recovery unit of the substrate processing apparatus according to the comparative example is lowered. However, a large difference (approximately 5.33 mm) in displace between the left and right bracket portions of the chemical recovery unit occurred within a period between 1.18 seconds and 0.8 seconds during which the chemical recovery unit is raised.

Figure 4:
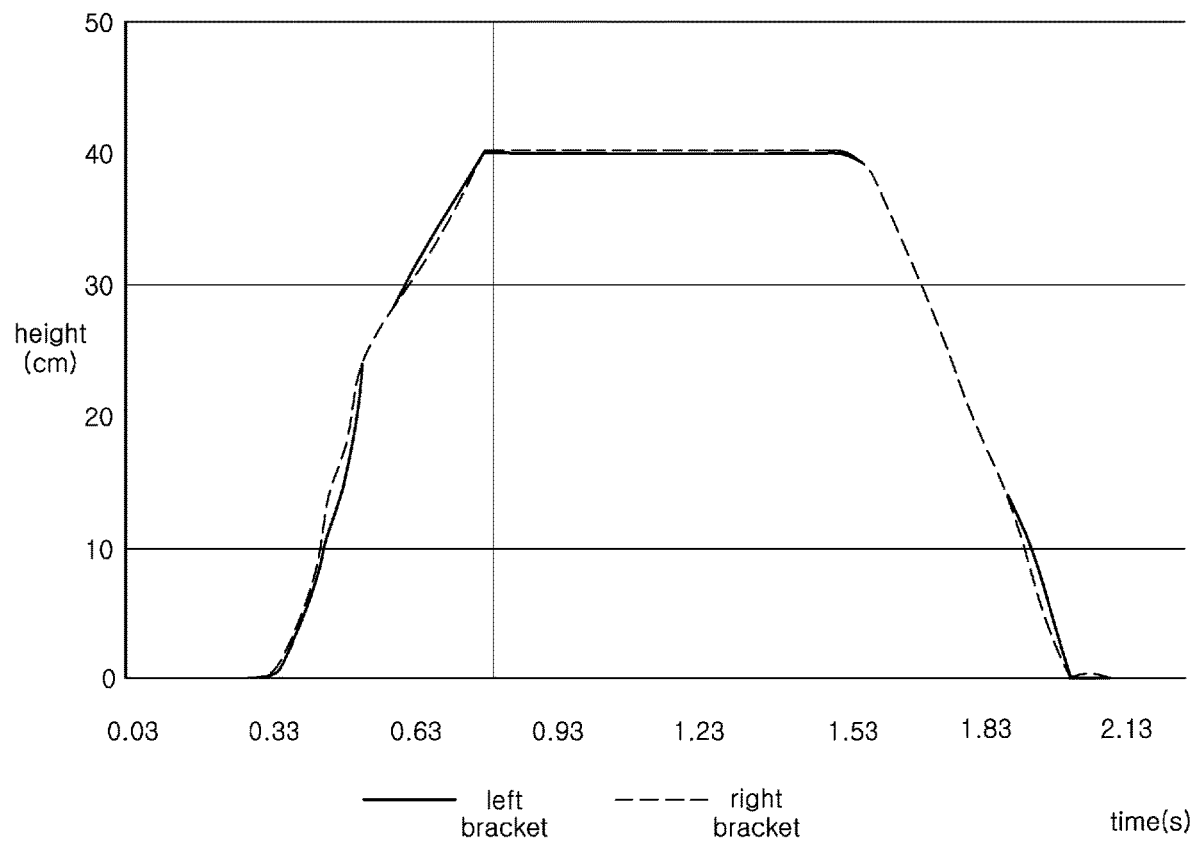
FIG. 4 is a graph illustrating the height of each of the left and right parts of a chemical recovery unit during the operation of a substrate processing apparatus according to one embodiment of the present invention.

Referring to FIG. 4, in the case of the substrate processing apparatus according to one embodiment of the present invention, a very little difference in displacement between the left and right bracket portions of the chemical recovery unit occurred within each period.

Figure 5:
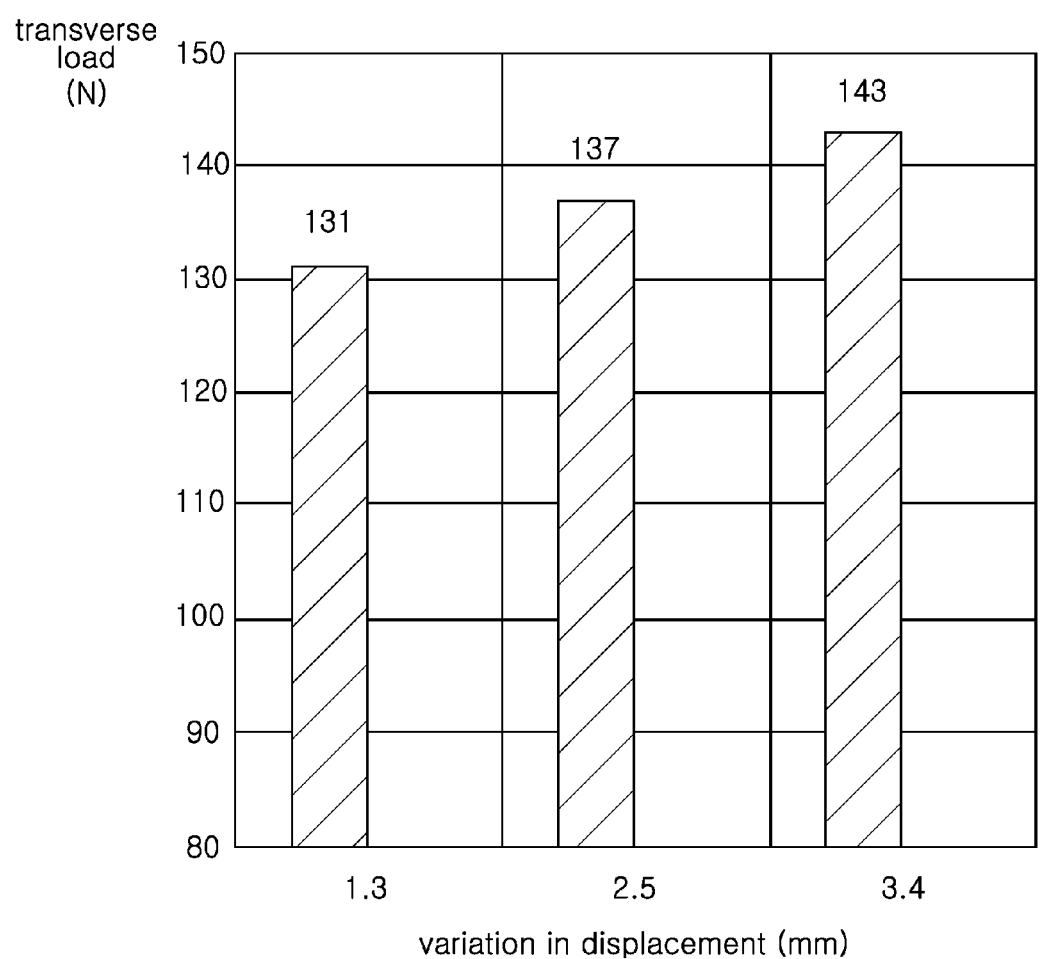
FIG. 5 is a graph illustrating a maximum transverse load applied to a cylinder according to a change in displacement of a chemical recovery unit of a substrate processing apparatus according to a comparative example.

Referring to FIG. 5, in the case of the substrate processing apparatus according to the comparative example, when the difference in displacement between the left and right bracket portions of the chemical recovery unit was 1.3 mm, a transverse load of 131 N was exerted on the cylinder. When the displacement difference was 2.5 mm, a transverse load of 137 N was exerted, and when the displacement difference was 3.4 mm, a transverse load of 143 N was exerted. That is, in the case of the substrate processing apparatus according to the comparative example, a considerable transverse load was exerted on the cylinder depending on the displacement difference between the left and right bracket portions.

Figure 6:
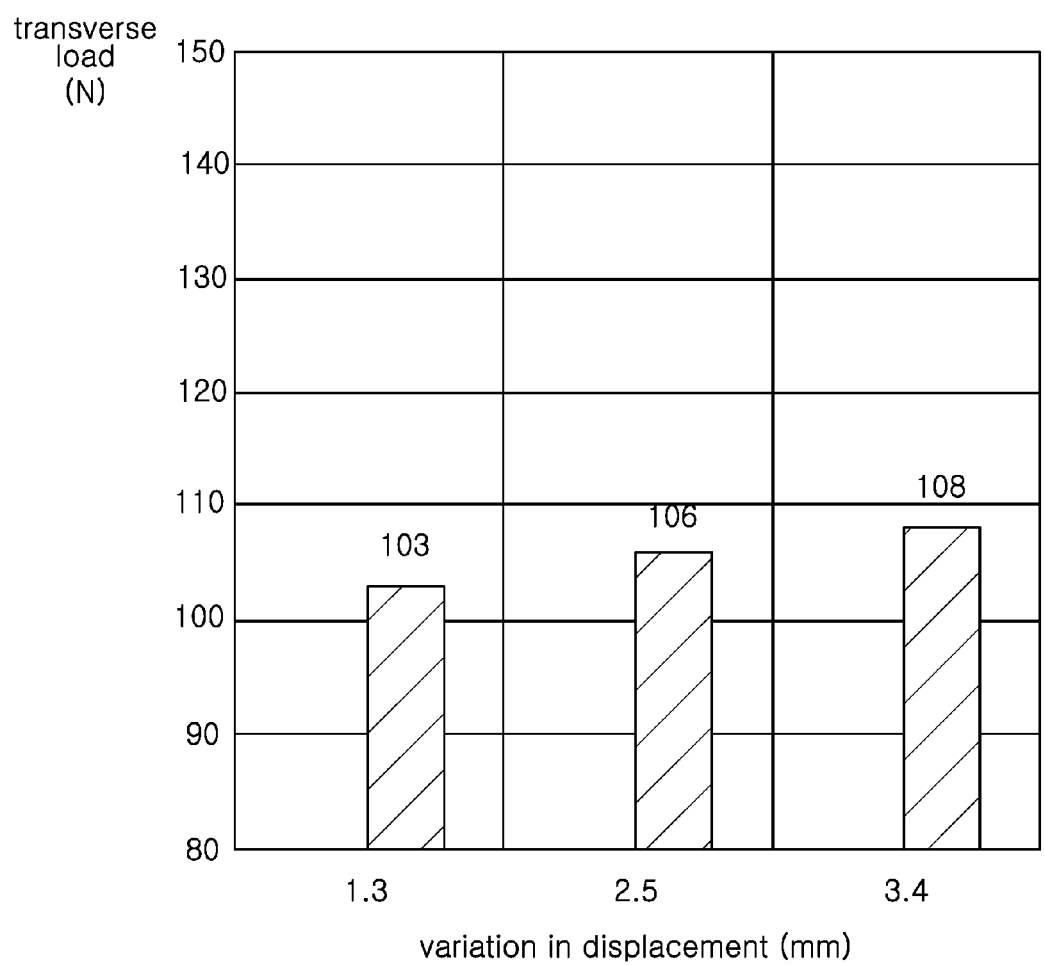
FIG. 6 is a graph illustrating a maximum transverse load applied to a cylinder according to a change in displacement of a chemical recovery unit of a substrate processing apparatus according to one embodiment of the present invention.

Referring to FIG. 6, in the case of the substrate processing apparatus according to one embodiment of the present invention, when the difference in displacement between the left and right bracket portions of the chemical recovery unit was 1.3 mm, a transverse load of 103 N was exerted on the cylinder. When the displacement difference was 2.5 mm, a transverse load of 106 N was exerted, and when the displacement difference was 3.4 mm, a transverse load of 108 N was exerted. That is, the substrate processing apparatus according to one embodiment of the present invention significantly reduces the transverse load applied to the cylinder compared to the substrate processing apparatus according to the comparative example.

Through this test, it was confirmed that during the operation of the substrate processing apparatus according to one embodiment of the present invention, the chemical recovery unit does not tilt and remains almost horizontal.

Referring to FIG. 2, as described above, the substrate processing apparatus 100 according to the present invention includes the position correction members 140. The lifting units 150A and 150B are attached to the left side surface and the right side surface of the chemical recovery unit 130, respectively. The position correction member 140 is installed between the lifting unit 150 and the chemical recovery unit 130. Therefore, even when a height difference occurs between the movable members 151 included in the respective lifting units 150A and 150B, the chemical recovery unit 130 is maintained almost horizontally by the position correction members 140.

Therefore, it is possible to prevent the cylinder 153 or the piston 154 from being damaged. For example, when the cylinder 153 is a pneumatic cylinder, it is possible to prevent air from leaking and to ensure that the piston 154 reaches the target position.

The substrate processing apparatus 100 according to the present invention enables the chemical recovery unit 130 to be horizontally oriented at all times, thereby enabling various chemical fluids to be surely introduced into the respective targeted inlets of the chemical recovery unit. Consequently, it is possible to prevent the recovered chemical fluids from being mixed with each other. This enables the recovered chemical fluids to be reused.

Figure 7:
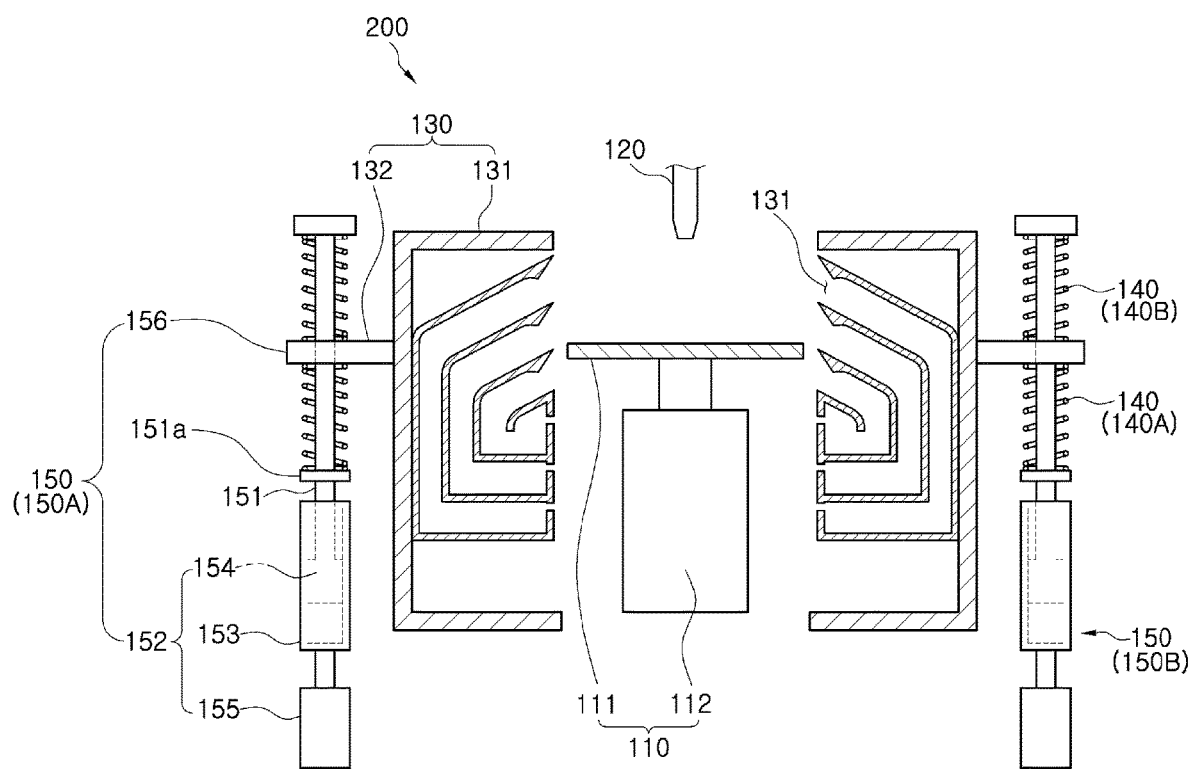
FIG. 7 is a view illustrating a substrate processing apparatus according to a second embodiment of the present invention.

Referring to FIG. 7, in a substrate processing apparatus 200 according to a second embodiment of the present invention, two position correction members 140A and 140B are engaged with one lifting unit.

Of the two position correction members 140A and 140B, one position correction member 140A is installed to surround a movable member 151 and is positioned between a driving force generation member 152 and a bracket portion 132. Of the two position correction members 140A and 140B, the other position correction member 140B is disposed between the retaining member 156 and the bracket portion 132.

In the substrate processing apparatus 200 according to the second embodiment of the present invention, an upper side and a lower side of the bracket portion 132 are elastically supported by the position correction member 140. Therefore, the chemical recovery unit 130 of the substrate processing apparatus 200 can be moved up and down more flexibly compared to the substrate processing apparatus 100 according to the first embodiment described above. Therefore, the chemical recovery unit 130 more reliably maintains its horizontal orientation.

Figure 8:
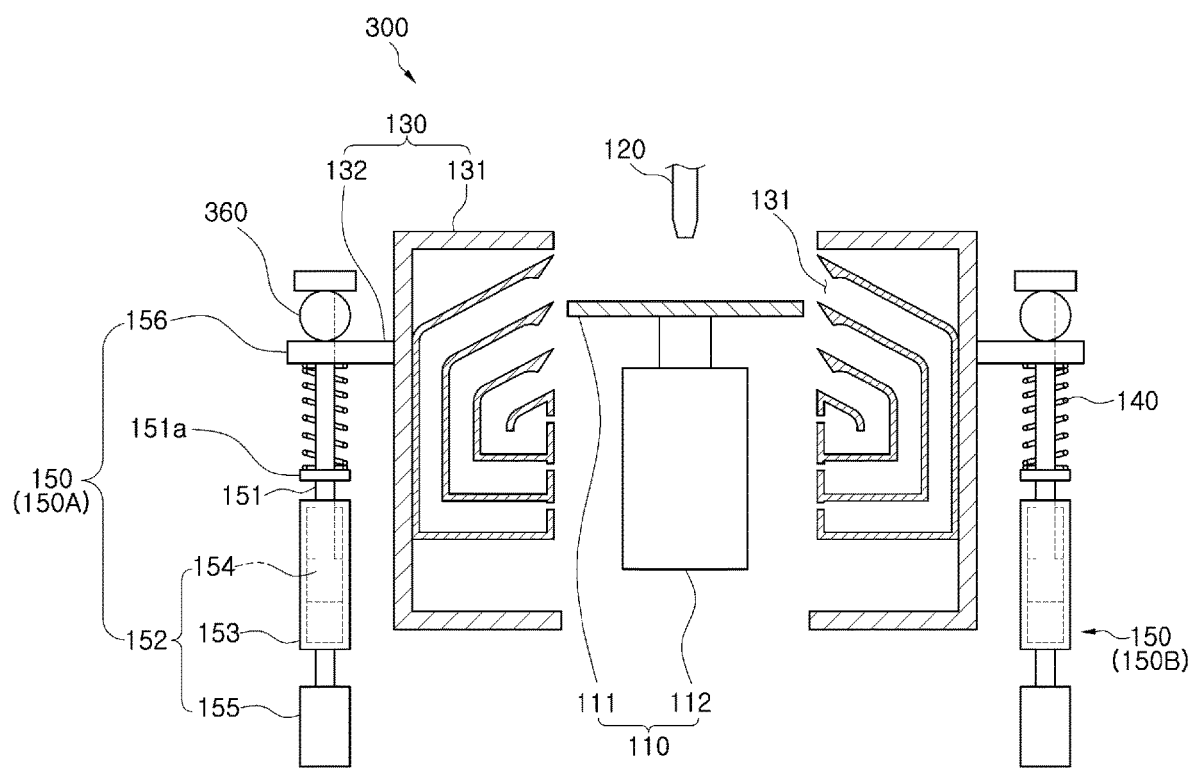
FIG. 8 is a view illustrating a substrate processing apparatus according to a third embodiment of the present invention.
Figure 9:
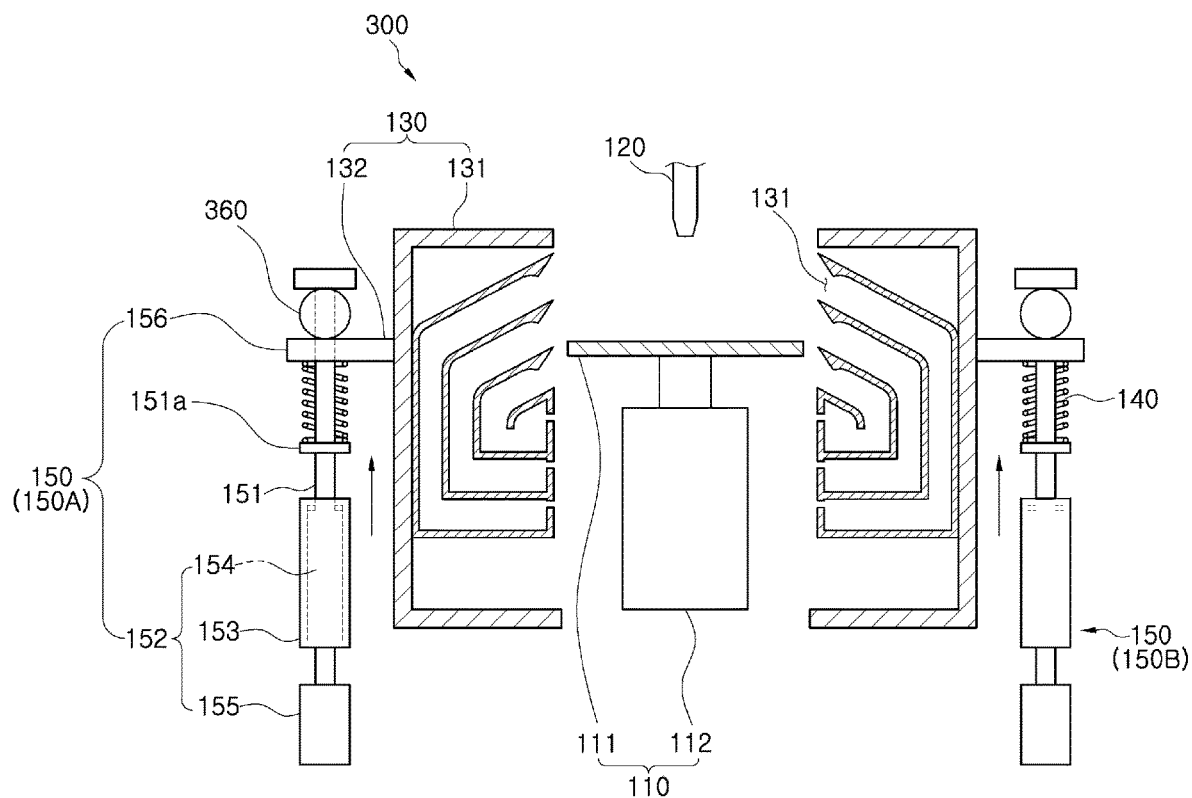
FIG. 9 is a view illustrating a process in which the chemical recovery unit of the substrate processing apparatus of FIG. 8 is raised.

Referring to FIGS. 8 and 9, a substrate processing apparatus 300 according to a third embodiment of the present invention additionally includes stress prevention members 360.

The stress prevention member 360 is installed such that an end portion of the movable member 151 passes through the stress prevention member 360. The stress prevention member 360 is positioned between the retaining member 156 and the bracket portion 132.

The stress prevention member 360 has, for example, a spherical shape. Accordingly, the stress prevention member 360 is in spot contact with the retaining member 156 and is in spot contact with the bracket portion 132.

When the chemical recovery unit 130 is about to tilt excessively due to an external impact or certain failure, the stress prevention member 360 prevents the bracket portion 132 and the retaining member 156 from coming into contact with each other. Therefore, it is possible to prevent the bracket portion 132 and the retaining member 156 from being strongly pressed by pointed portions (i.e., sharp edges or corners) such as edges thereof, thereby preventing the bracket portion 132 and the retaining member 156 from being damaged.

Figure 10:
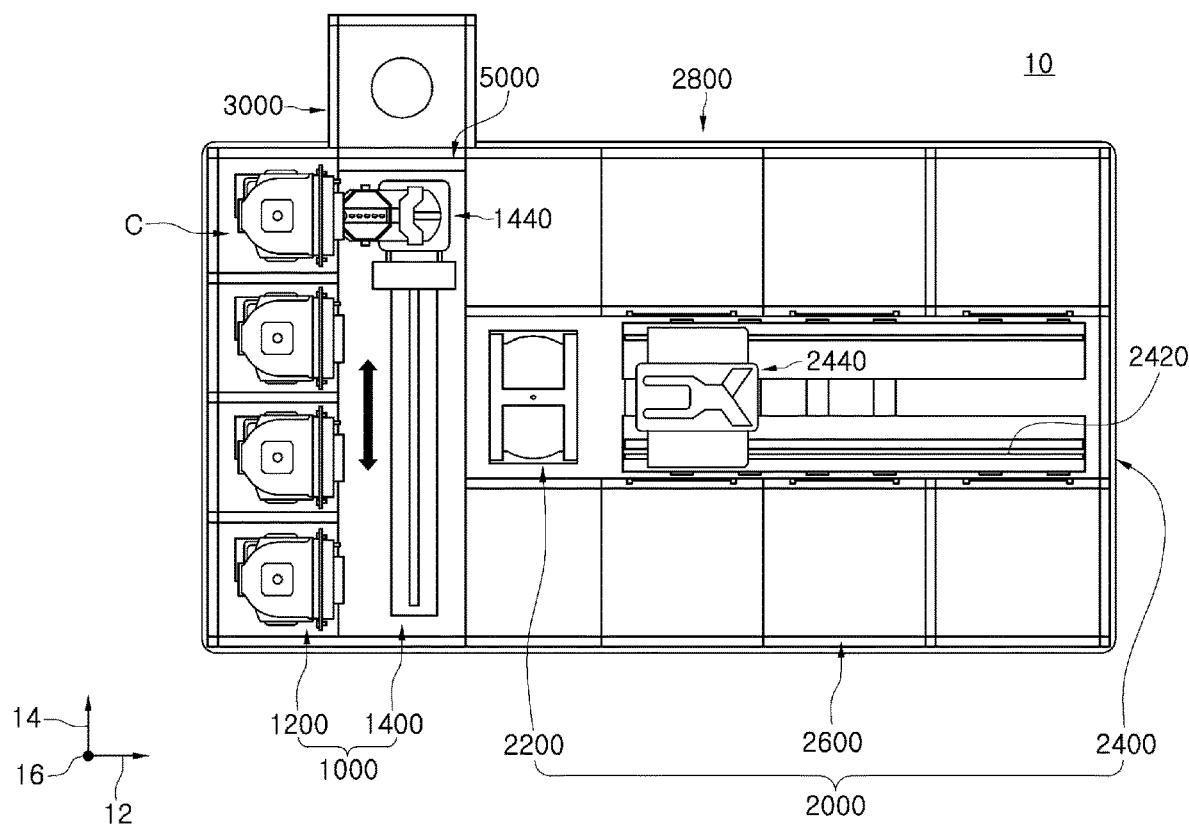
FIG. 10 is a view illustrating a substrate processing equipment according to one embodiment of the present invention.

FIG. 10 is a plan view schematically illustrating a substrate processing equipment according to one embodiment of the present invention. Referring to FIG. 10, a substrate processing equipment 10 includes an index unit 1000 and a process performing unit 2000.

The index unit 1000 includes multiple load ports 1200 and an index chamber 1400. The load ports 1200, the index chamber 1400, and the process performing unit 2000 are arranged in this order. Hereinafter, a direction in which the load ports 1200, the index chamber 1400, and the process performing unit 2000 are arranged is referred to as first direction 12. When viewed from above, a direction perpendicular to the first direction 12 is referred to as second direction 14. A direction perpendicular to the plane defined by the first direction 12 and the second direction 14 is referred to as third direction 16.

Each of the load ports 1200 supports a substrate carrier C in which multiple substrates W are received. The multiple load ports 1200 are arranged in the second direction 14. In FIG. 10, four load ports 1200 are illustrated. However, the number of load ports 1200 is increased or decreased depending on the process efficiency of the process performing unit 2000 and conditions such as the footprint of the process pertaining unit 2000. As the substrate carrier C, a front opening unified pod (FOUP) may be used.

The index chamber 1400 is located between an array of the load ports 1200 and the process performing unit 2000. The index chamber 1400 has a rectangular parallelepiped shape defined by a front panel, a rear panel, and two side panels. An index robot 1440 for shuttling the substrate carrier C between the load port 1200 and a load lock chamber 2200. Although not illustrated, the index chamber 1400 includes vents and a controlled air flow system such a laminar flow system, to prevent particles from entering the interior space of the index chamber 1400.

The process performing unit 2000 includes a load lock chamber 2200, a transfer chamber 2400, and a fluid-involved processing chamber 2600. The transfer chamber 2400 is oriented such that the longitudinal direction thereof is parallel to the first direction 12. The fluid-involved processing chambers 2600 are arranged in the second direction 14. Specifically, the fluid-involved processing chambers are disposed on one side (hereinafter, referred to as first side)

of the transfer chamber 2400 and on the opposite side (hereinafter, referred to as second side), respectively.

Some of the fluid-involved processing chambers 2600 are arranged in a longitudinal direction of the transfer chamber 2400. Some of the fluid-involved processing chambers 2600 are stacked with each other.

That is, on the first side of the transfer chamber 2400, the fluid-involved processing chambers 2600 are arranged in an array of A×B (where A and B are natural numbers each of which is 1 or greater). Here, A is the number of fluid-involved processing chambers 2600 arranged in series along the first direction 12, and B is the number of fluid-involved processing chambers 2600 arranged in series along the third direction 16.

The load lock chamber 2200 is located between the index chamber 1400 and the transfer chamber 2400. The load lock chamber 2200 provides a loading space for temporarily storing substrates W before the substrates W are transferred to the transfer chamber 2400 or to the index chamber 1400 when the substrates W are shuttled between the transfer chamber 2400 and the index chamber 1400. The load lock chamber 2200 includes a plurality of slots (not illustrated) into which the substrates W are to be inserted. The slots are spaced apart from each other and are arranged in the third direction 16. The load lock chamber 2200 is open at one side facing the index chamber 1400 and is also open at another side facing the transfer chamber 2400.

The transfer chamber 2400 transfers the substrates W between the load lock chamber 2200 and the fluid-involved processing chamber 2600. The transfer chamber 2400 includes a guide rail 2420 and a main robot 2440. The guide rail 2420 is oriented such that the longitudinal direction thereof is parallel to the first direction 12. The main robot 2440 is installed on the guide rail 2420 so that the main robot 2440 can linearly move on the guide rail 2420 along the first direction 12.

Herein, a constituent element that transfers the substrate W is defined as the transfer unit. For example, the transfer unit includes the transfer chamber 2400 and the index chamber 1400. In addition, the transfer unit includes the main robot 2440 disposed in the transfer chamber 2400 and the index robot 1440.

The inside of the fluid-involved processing chamber 2600 is provided with a substrate processing apparatus that performs a fluid-involved treatment process such as a cleaning process on the substrate W. For example, the cleaning process is a process of rinsing the substrate W and striping and removing organic residue on the substrate W, using a treatment fluid containing alcohol. The substrate processing apparatuses disposed in the respective the fluid-involved processing chambers 2600 have different structures depending on the type of cleaning process performed. Alternatively, the substrate processing apparatuses disposed in the respective fluid-involved processing chambers 2600 may have the same structure. Alternatively, the fluid-involved processing chambers 2600 are divided into a plurality of groups. The substrate processing apparatuses disposed in the fluid-involved processing chambers 2600 belong to the same group have the same structure and the substrate processing apparatuses disposed in the fluid-involved processing chambers 2600 belonging to different groups have different structures. The substrate processing apparatus described with reference to FIGS. 1 to 9 may be provided in the fluid-involved processing chamber 2600.

A substrate processing equipment according to another aspect of the present invention includes a load port 1200 that supports a substrate carrier C in which substrates W are received, an index chamber 1400 equipped with an index robot 1440 that transfer the substrates W from the substrate carrier C supported on the load port 1200, and a process performing unit 2000 in which the substrate processing apparatus 100 that performs a fluid-involved treatment process on the substrates W is provided. The substrate processing apparatus 100 includes a rotation unit 110 that supports and rotates a substrate, a chemical ejection unit 120 that ejects a chemical fluid toward the rotation unit 110, a chemical recovery unit 130 disposed close to the rotation unit 110 and configured to recover a chemical fluid scattered from the rotation unit 110, lifting units 150 coupled to the chemical recovery unit 130 and configured to allow the chemical recovery unit 130 to move up and down relative to the rotation unit 110, and one or more position correction members 140 that enable the chemical recovery units 130 to be elastically supported by the lifting units 150 and change the relative position of the chemical recovery unit with respect to the lifting units 150.

Although various embodiments of the present invention have been described above, the drawings and detailed description of the present invention are intended to illustrate the present invention and are not intended to limit the scope of the present invention. Therefore, those skilled in the art will appreciate that various modifications and equivalents thereto are possible. Accordingly, the true technical protection scope of the present invention should be determined by the technical idea defined in the appended claims.

What is claimed is:

1. A substrate processing apparatus comprising:
a rotation unit configured to support and rotate a substrate;
a chemical ejection unit configured to eject a chemical fluid toward the rotation unit;
a chemical recovery unit disposed close to the rotation unit and configured to collect a chemical fluid scattered from the rotation unit;
a lifting unit coupled to the chemical recovery unit and configured to move upward and downward the chemical recovery unit relative to the rotation unit; and
a first position correction member configured to allow the chemical recovery unit to be elastically supported by the lifting unit and change a relative position of the chemical recovery unit with respect to the lifting unit,
wherein the first position correction member is a compression spring.

2. The apparatus according to claim 1,
wherein the chemical recovery unit comprises:
a body portion configured to collect the chemical fluid scattered from the rotation unit; and
a bracket portion protruding outward from the body portion, wherein the lifting unit is coupled to the bracket portion of the chemical recovery unit.

3. The apparatus according to claim 2,
wherein the lifting unit comprises:
a movable member having a rod shape, having an end portion passing through the bracket portion, and configured to support the first position correction member;
a driving force generation member configured to raise and lower the movable member; and
a retaining member coupled to an end portion of the movable member in a state in which the end portion of the movable member passes through the bracket portion.

4. The apparatus according to claim 3,
wherein the first position correction member is installed to surround the movable member and is positioned between the driving force generation member and the bracket portion.

5. The apparatus according to claim 3, further comprising:
a stress prevention member positioned between the retaining member and the bracket portion and installed such that the movable member extends through the stress prevention member.

6. The apparatus according to claim 5,
wherein the stress prevention member has a spherical shape.

7. The apparatus according to claim 3,
wherein the first position correction member includes a lower position correction member that is installed to surround the movable member and positioned between the driving force generation member and the bracket portion, and an upper position correction member that is positioned between the retaining member and the bracket portion.

8. The apparatus according to claim 3,
wherein the driving force generation member comprises:
a cylinder having an interior space;
a piston positioned in the interior space of the cylinder, coupled to the movable member, and configured to be movable along a longitudinal direction of the cylinder; and
a pressure regulator connected to the cylinder and configured to adjust a pressure in the interior space of the cylinder.

9. A substrate processing equipment comprising:
a load port configured to support a substrate carrier in which a substrate is contained;
a substrate processing apparatus; and
an index chamber in which a transfer robot that transfers the substrate from the substrate carrier supported on the load port to the substrate processing apparatus is disposed,
wherein the substrate processing apparatus comprises:
a rotation unit configured to support and rotate the substrate transferred from the load port;
a chemical ejection unit configured to eject a chemical fluid toward the rotation unit;
a chemical recovery unit disposed close to the rotation unit and configured to collect a chemical fluid scattered from the rotation unit;
a lifting unit coupled to the chemical recovery unit and configured to move upward and downward the chemical recovery unit relative to the rotation unit; and
a first position correction member configured to allow the chemical recovery unit to be elastically supported by the lifting unit and change a relative position of the chemical recovery unit with respect to the lifting unit.

10. The substrate processing equipment according to claim 9,
wherein the chemical recovery unit comprises:
a body portion configured to collect the chemical fluid scattered from the rotation unit; and
a bracket portion protruding outward from the body portion, wherein the lifting unit is coupled to the bracket portion of the chemical recovery unit.

11. The substrate processing equipment according to claim 10,
wherein the lifting unit comprises:
a movable member having a rod shape, having an end portion passing through the bracket portion, and configured to support the first position correction member;
a driving force generation member configured to raise and lower the movable member; and
a retaining member coupled to an end portion of the movable member in a state in which the end portion of the movable member passes through the bracket portion.

12. The substrate processing equipment according to claim 11,
wherein the first position correction member is installed to surround the movable member and is positioned between the driving force generation member and the bracket portion.

13. The substrate processing equipment according to claim 11, further comprising:
a stress prevention member positioned between the retaining member and the bracket portion and installed such that the movable member extends through the stress prevention member.

14. The substrate processing equipment according to claim 13,
wherein the stress prevention member has a spherical shape.

15. The substrate processing equipment according to claim 11,
wherein the first position correction member includes a lower position correction member that is installed to surround the movable member and positioned between the driving force generation member and the bracket portion, and an upper position correction member that is positioned between the retaining member and the bracket portion.

16. The substrate processing equipment according to claim 11,
wherein the driving force generation member comprises:
a cylinder having an interior space;
a piston positioned in the interior space of the cylinder, coupled to the movable member, and configured to be movable along a longitudinal direction of the cylinder; and
a pressure regulator connected to the cylinder and configured to adjust a pressure in the interior space of the cylinder.

17. The substrate processing equipment according to claim 9,
wherein the first position correction member is a compression spring.

* * * * *